(12) United States Patent
Ogawa

(10) Patent No.: US 6,380,977 B1
(45) Date of Patent: Apr. 30, 2002

(54) CCD-TYPE SOLID STATE IMAGE SENSOR WITH A WIRING ARRANGEMENT THAT IMPROVES FLATNESS

(75) Inventor: Chihiro Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/028,677

(22) Filed: Feb. 24, 1998

(30) Foreign Application Priority Data

Feb. 25, 1997 (JP) .............................................. 9-040334

(51) Int. Cl.⁷ ............................................... H04N 5/335
(52) U.S. Cl. ........................................ 348/311; 257/229
(58) Field of Search ................................ 348/294, 302, 348/305, 311, 315, 316, 319, 320, 321, 322, 323, 324; 257/229, 230, 231, 232, 233; H04N 5/335

(56) References Cited

U.S. PATENT DOCUMENTS 6,087,685 A * 7/2000 Harada ........................ 257/232
6,160,580 A * 12/2000 Nakashiba ................... 348/320
6,222,586 B1 * 4/2001 Nagakawa ................... 348/311
6,248,133 B1 * 6/2001 Komobuchi et al. ........ 348/311

* cited by examiner

Primary Examiner—Tuan Ho
(74) Attorney, Agent, or Firm—Sughrue Mion, PLLC (57) ABSTRACT

In a solid state image pickup device of the invention, photoelectric transforming regions in each of which a plurality of photoelectric transforming parts are arranged at predetermined intervals in a first predetermined direction and charge transfer regions extending in the first direction are alternately arranged in a second predetermined direction which perpendicularly crosses the first predetermined direction. There are also provided bridge regions formed in regions sandwiched by two photoelectric transforming parts in order to connect the charge transfer regions neighboring in the second predetermined direction. The bridge region has: a first bridge wiring extending in the second predetermined direction; an oxide film formed so as to cover the periphery of the first bridge wiring; and second and forth bridge wirings formed via the oxide film on the side wall part of the first bridge wiring in the first predetermined direction.

3 Claims, 11 Drawing Sheets

PRIOR ART

CCD-TYPE SOLID STATE IMAGE SENSOR WITH A WIRING ARRANGEMENT THAT IMPROVES FLATNESS

BACKGROUND OF THE INVENTION

1. Field of the Invention

The present invention relates to a CCD (Charge Coupled Device) type solid state image pickup device and more particularly to its structure.

2. Related Background Art

Hitherto, there are a progressive CCD-type solid state image pickup device and an interlace CCD-type solid state image pickup device as typical CCD-type solid state image pickup devices. According to the progressive CCD, data can be read from all of unit pixels arranged in an image region. The progressive CCD has an advantage that the resolution in the vertical direction of the image region is higher than that of the interlace CCD. In the progressive CCD, however, at least three, more generally, four transfer electrodes for transferring charges have to be provided with respect to one pixel.

From the viewpoint of the device structure, it is preferable for both of the progressive CCD and the interlace CCD that the surface of the device is flat. That is, if the surface is not so flat, the accuracy at the time of fabrication deteriorates. For example, when the surface is not so flat, it is necessary to form a thick photo resist film in a photo resist process and a focus margin is reduced. Consequently, it is difficult to proceed a fine pattern. When the fine process is difficult, the degree of integration is lowered and it is difficult to widen the opening of a photoelectric transforming part. That is, when the surface is not so flat, deterioration in the degree of integration and the sensitivity is caused.

SUMMARY OF THE INVENTION

It is, therefore, an object of the invention to provide a CCD-type solid state image pickup device having the construction with improved flatness.

It is another object of the invention to provide a CCD-type solid state image pickup device having the construction suited for a fine process.

It is further another object of the invention to provide a CCD-type solid state image pickup device having a wide opening of a photoelectric transforming part.

According to the invention, there is provided a CCD-type solid state image pickup device having a plurality of photoelectric transforming regions in each of which a plurality of photosensitive devices are arranged in a first predetermined direction at predetermined intervals and a plurality of charge transfer regions for transferring charges obtained by photoelectric transforming operation of the photosensitive devices. The photoelectric transforming regions and the charge transfer regions are alternately arranged in a second predetermined direction which perpendicularly crosses the first predetermined direction. The device also has bridge regions provided at the predetermined intervals of the photoelectric transforming regions in order to connect the charge transfer regions neighboring in the second predetermined direction. The bridge region has a first wiring extending in the second predetermined direction, an insulating film formed so as to cover the periphery of the first wiring in the bridge region, and second and third wirings formed via the insulating film on the side wall part of the first wiring in the first predetermined direction so as to extend in the second predetermined direction.

According to the invention, since it is constructed so that another wiring is arranged on the side wall part of one wiring, the flatness is improved. Consequently, when a resist is applied on the whole face, a thin photo resist can be used. The focus margin is accordingly enlarged and a process of a fine pattern is facilitated. Since etching residue does not easily occur on the side wall part of the base pattern in the event of etching a shielding film, the yield is improved.

DETAILED DESCRIPTION OF THE PREFERRED EMBODIMENTS

A CCD-type solid state image pickup device according to an embodiment of the invention will be described with reference to the drawings. The invention will be described hereinbelow in accordance with the order of an embodiment in which the invention is applied to a progressive CCD and an embodiment in which the invention is applied to an interlace CCD. In the description of each of the embodiments, for understanding of the superiority of the invention, a solid state image pickup device as a reference having a flatness less good as compared with the solid state image pickup device according to the invention will be first described and the solid state image pickup device according to the embodiment will be subsequently described.

The embodiment in which the invention is applied to the progressive CCD will be first described.

Figure 8:
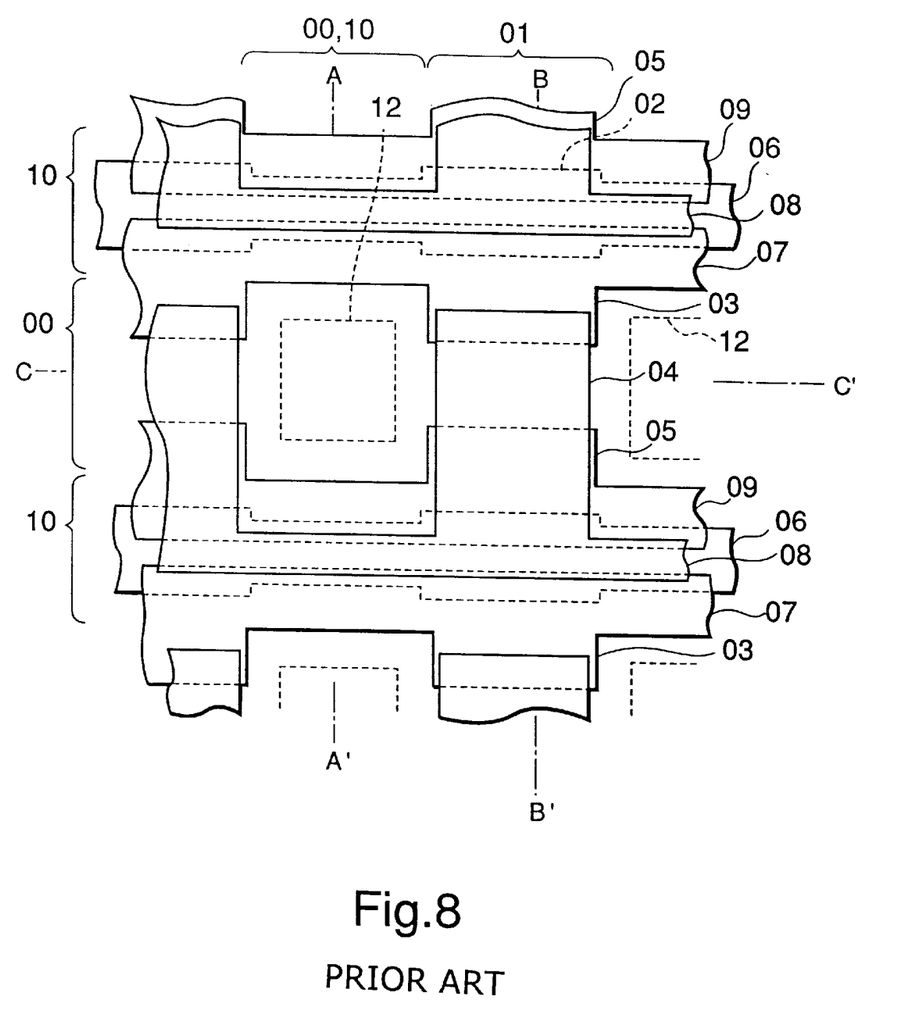
FIG. 8 is a plan view showing the construction of a progressive CCD-type solid state image pickup device as a reference for explaining superiority of the CCD-type solid state image pickup device according to the embodiment of the invention.

FIG. 8 shows a solid state image pickup device as an object to be compared in order to clarify the superiority of the solid state image pickup device of the embodiment. The structure of the solid state image pickup device as a reference will be described with reference to FIGS. 9(a) to (c).

Figure 9A:
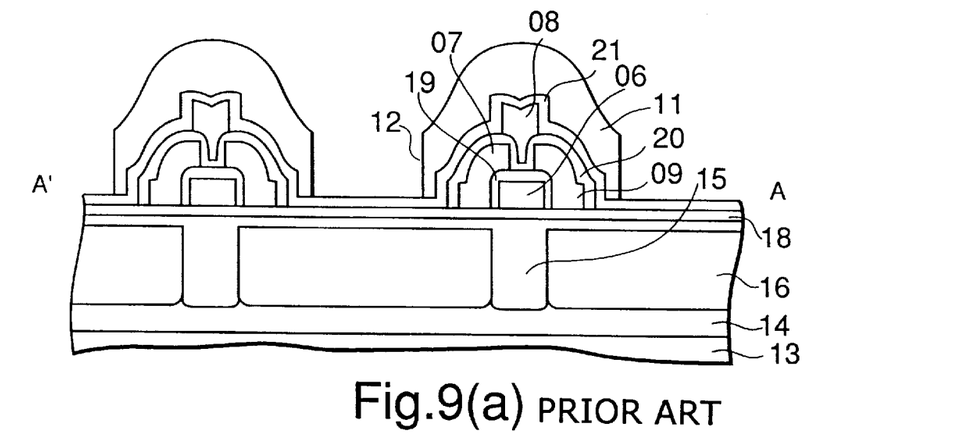
FIG. 9(a) is a cross section taken on line A–A' of FIG. 8.
Figure 9B:
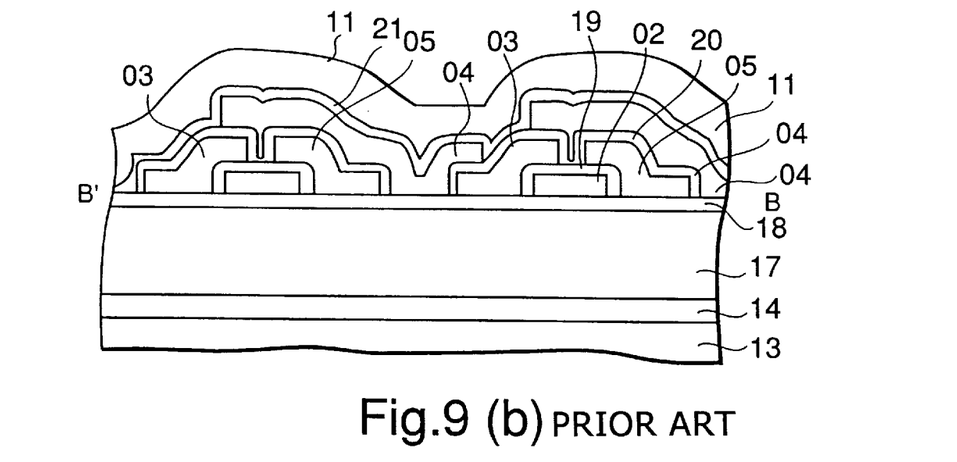
FIG. 9(b) is a cross section taken on line B–B' of FIG. 8.
Figure 9C:
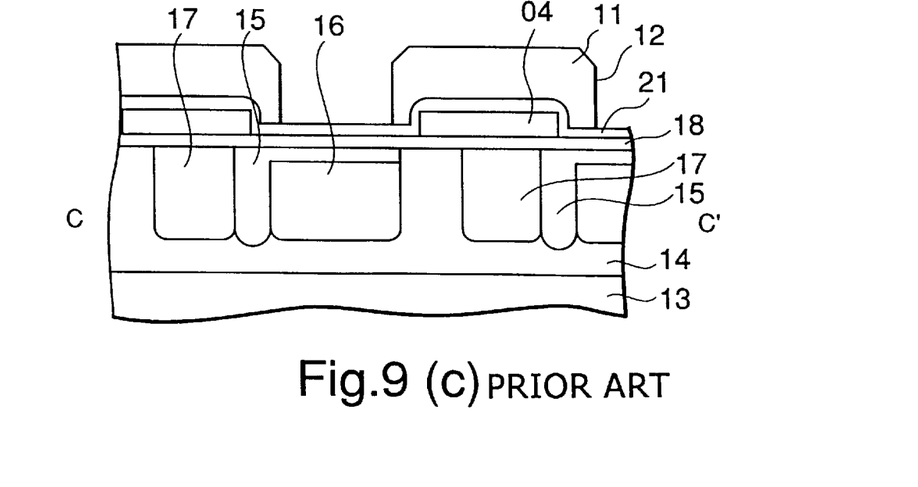
FIG. 9(c) is a cross section taken on line C–C' of FIG. 8.

As shown in FIG. 8, the CCD-type solid state image pickup device as a reference has; photoelectric transforming parts 00 each having an opening 12; bridge regions 10 provided on and under the photoelectric transforming part 00 in an image region; and charge transfer regions 01 provided on the right and left sides of the photoelectric transforming part 00 and the bridge part region 10 in the image region. As shown in FIG. 9, the photoelectric transforming part 00 has the opening 12 formed in a shielding film 11. The charge transfer region 01 has first to fourth charge transfer electrodes 02 to 05 and the bridge region 10 has first to fourth bridge wirings 06 to 09. Further, the first to fourth charge transfer electrodes 02 to 05 of the charge transfer region 01 are connected to first to fourth charge transfer electrodes 02 to 05 of the charge transfer region 01 neighboring in the image region by the first to fourth bridge wirings 06 to 09 of the bridge region 10. The first transfer electrode 02 and the first bridge wirings 06 are formed by a first polysilicon layer, the second transfer electrode 03, the second bridge wiring 07, the fourth transfer electrode 05 and the fourth bridge wiring 09 are formed by a second polysilicon layer, and the third transfer electrode 04 and the third bridge wiring 08 are formed by a third polysilicon layer.

In the CCD-type solid state image pickup device as a reference having such a construction, light entering the opening 12 is transformed to charges by the photoelectric transforming part 00 and the charges are outputted from the charge transfer region 01.

A method of fabricating the CCD-type solid state image pickup device as a reference will be described with reference to FIG. 9.

First, a p-well 14 is formed on the surface of an n-type silicon substrate 13. A p+ type device separating region 15, an n-type photoelectric transforming region 16, and an n-type charge transfer region 17 are formed in predetermined regions in the p-well 14. A gate insulating film 18 made of silicon nitride, silicon oxide, or the like is formed on the whole face.

A polysilicon layer including an impurity such as phosphorus is deposited and is patterned, thereby forming the first polysilicon layer as the first charge transfer electrode 02 and the first bridge wiring 06. Further, thermal oxidation is performed and the surface of the first polysilicon layer, that is, the peripheral part of the first charge transfer electrode 02 and the first bridge wiring 06 is transformed to an oxide film 19.

A polysilicon layer including an impurity such as phosphorus is subsequently deposited and is patterned, thereby forming the second polysilicon layer as the second charge transfer electrode 03, the second bridge wiring 07, the fourth charge transfer electrode 05, and the fourth bridge wiring 09. Further thermal oxidation is performed and the surface of the second polysilicon layer, that is, the peripheral part of the second charge transfer electrode 03, the second bridge wiring 07, the fourth charge transfer electrode 05, and the fourth bridge wiring 09 is transformed to an oxide film 20.

Subsequently, a polysilicon layer containing an impurity such as phosphorus is deposited and is patterned, thereby forming the third polysilicon layer as the third charge transfer electrode 04 and the third bridge wiring 08.

After that, an insulating film 21 is deposited on the whole surface. Further, the shielding film 11 made of a metal such as aluminium, tungsten, or the like is deposited and a predetermined region of the shielding film 11 is removed by patterning, thereby forming the opening 12.

In this manner, the CCD-type solid state image pickup device as a reference shown in FIGS. 8 and 9 can be obtained.

The solid state image pickup device as a reference has, however, a problem that since the charge transfer electrodes and the bridge wirings are piled up on the substrate in the vertical direction, the surface is not so flat and it is difficult to form a fine pattern.

For example, the second and fourth charge transfer electrodes 03 and 05 are formed on the first charge transfer electrode 02, the third charge transfer electrode 04 is further formed on the electrodes 03 and 05. The second and fourth bridge wirings 07 and 09 are formed on the first bridge wiring 06 and the further the third bridge wiring 08 is formed. That is, when attention is paid to a part where the electrodes and the wirings are piled up, the three polysilicon layers and the oxide films 19 and 20 are piled up on the substrate in the vertical direction. Consequently, the height in the part is higher than the other part and the surface is not so flat. Since the surface is rough, it is necessary to form a thick photo resist film in a photo resist process, for example, when the opening 12 is formed. Further, the focus margin is reduced so that it is difficult to form a fine pattern, or residue is caused in the event of etching the shielding film 11. That is, a problem such that the base pattern remains on the electrodes and side walls of the wirings.

Further, in the solid state image pickup device as a reference, the opening 12 formed on the shielding film 11 cannot be largely opened, so that there is a problem that the sensitivity cannot be accordingly increased.

That is, when attention is paid to the bridge part region 10 provided between two photoelectric transforming parts 00 which are neighboring in the vertical direction in the image region (refer to FIG. 8), four wirings of the first to fourth bridge wirings 06 to 09 exist. Further, referring to FIG. 9, it is understood that the second bridge wiring 07 and the fourth bridge wiring 09 formed by the second polysilicon layer are arranged in the lateral direction (vertical direction in FIG. 8). Moreover, the second bridge wiring 07 and the fourth bridge wiring 09 cover the first bridge wiring 06 in the bridge part region 10. Consequently, it is difficult to narrow the width of each of the wirings from the viewpoint of fabrication and the opening 12 cannot be accordingly largely formed.

The solid state image pickup device according to the embodiment will be described with reference to FIGS. 1 to 4.

Figure 1:
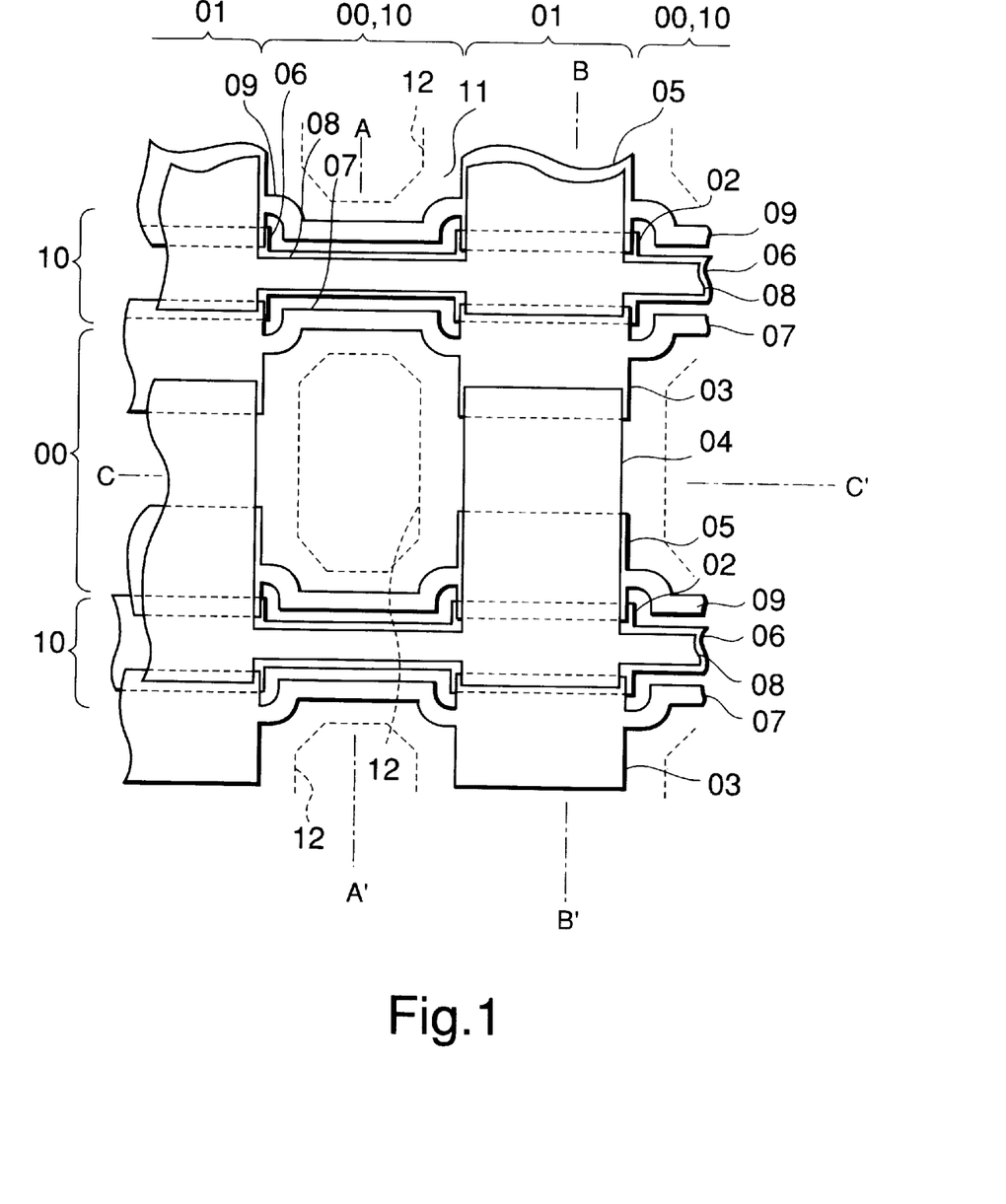
FIG. 1 is a plan view showing the construction of a progressive CCD-type solid state image pickup device according to an embodiment of the invention.
Figure 2:
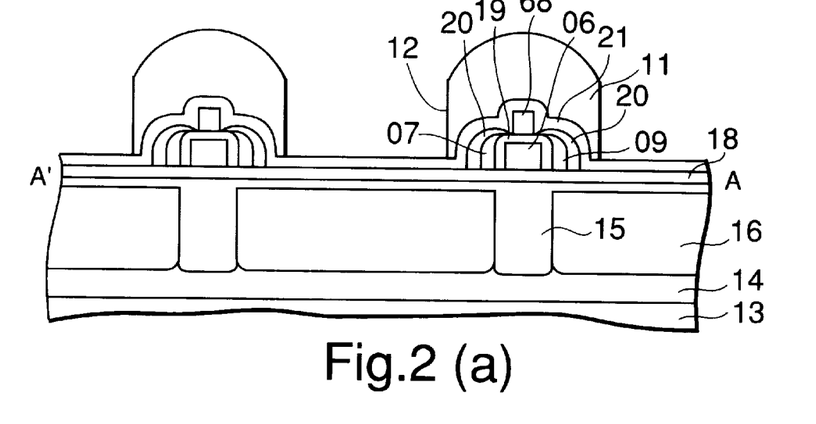
FIG. 2(a) is a cross section taken on line A–A' of FIG. 1.
FIG. 2(b) is a cross section taken on line B–B' of FIG. 1.
FIG. 2(c) is a cross section taken on line C–C' of FIG. 1.

The CCD-type solid state image pickup device according to the embodiment has a construction shown in FIGS. 1 and 2. FIG. 1 is a plan view showing the construction of the CCD-type solid state image pickup device according to the embodiment. FIGS. 2(a) to 2(c) are cross sections taken on lines A–A', B–B' and C–C' of FIG. 1, respectively.

As shown in FIG. 1, the CCD-type solid state image pickup device of the embodiment has a plurality of photoelectric transforming parts 00, a plurality of bridge regions 10, and a plurality of charge transfer regions 01.

The charge transfer regions 01 are formed so as to extend in a first predetermined direction (vertical direction of the drawing). The plurality of charge transfer regions 01 are provided at intervals in a second predetermined direction (lateral direction of the drawing). In areas between the charge transfer regions 01 neighboring in the second predetermined direction, the plurality of photoelectric transforming parts 00 are arranged in the first predetermined direction at predetermined intervals. The bridge regions 10 are provided so as to be sandwiched by the photoelectric transforming parts 00 neighboring in the first predetermined direction. In this case, the region sandwiched by the charge transfer regions 01 neighboring in the second predetermined direction, that is, that region in which the bridge regions 10 and the photoelectric transforming parts 00 are alternately arranged in the first predetermined direction is called a photoelectric transforming region. The whole region having the charge transfer regions 01 and the photoelectric transforming region is called an image region. For example, the vertical direction of FIG. 1 is called the vertical direction of the image region and the lateral direction of FIG. 1 is called the horizontal direction of the image region.

Each of the photoelectric transforming parts 00 has the opening 12 for receiving and photoelectric transforming light. Each of the charge transfer regions 01 is used to transfer the charges obtained by photoelectric transforming the light by the corresponding photoelectric transforming part 00. The bridge region 10 is used to connect the charge transfer regions 01 neighboring in the second predetermined direction.

More specifically, the photoelectric transforming part 00 has the opening 12 formed in the shielding film 11 as shown in FIG. 2(*a*). As shown in FIG. 2(*b*), the charge transfer region 01 has the first to fourth charge transfer electrodes 02 to 05. As shown in FIG. 2(*a*), the bridge region 10 has the first to fourth bridge wirings 06 to 09. As shown in the cross section, the first to fourth charge transfer electrodes 02 to 05 are electrically disconnected by interposing insulating members. Similarly, the first to fourth bridge wirings 06 to 09 are insulated from each other as understood from the cross section. Further, the first to fourth charge transfer electrodes 02 to 05 of the charge transfer region 01 are connected to the first to fourth charge transfer electrodes 02 to 05 of another charge transfer region 01 which is neighboring in the horizontal direction of the image region by the first to fourth bridge wirings 06 to 09 of the bridge region 10, respectively. In the embodiment, the first charge transfer electrode 02 and the first bridge wiring 06 are formed by a first polysilicon layer, the second charge transfer electrode 03 and the second bridge wiring 07 and the fourth charge transfer electrode 05 and the fourth bridge wiring 09 are formed by a second polysilicon layer, and the third charge transfer electrode 04 and the third bridge wiring 08 are formed by a third polysilicon layer.

In the CCD-type solid state image pickup device of the embodiment having such a construction, the light entering the opening 12 is transformed to charges by the photoelectric transforming part 00 and the charges are generated to the outside (not shown) from the charge transfer region 01.

A method of fabricating the CCD-type solid state image pickup device according to the embodiment will be described hereinbelow with reference to FIGS. 1 to 4.

First, the p-well region 14 is formed on the surface of the n-type silicon substrate 13. The p+ type device separating region 15, the n-type photoelectric transforming part 16, and the n-type charge transfer region 17 are sequentially formed.

The gate insulating film 18 made of silicon nitride, silicon oxide, or the like is formed on the entire face.

After the polysilicon layer containing an impurity such as phosphorus is deposited on, for example, the whole face of the gate insulating film 18, patterning is performed by using a photo resist of a predetermined shape, thereby forming the first polysilicon layer as the first charge transfer electrode 02, and the first bridge wiring 06, and the photo resist is removed. Further, thermal oxidation is performed and the surface of the first polysilicon layer, that is, the peripheral part of the first charge transfer electrode 02 and the first bridge wiring 06 is transformed to the oxide film 19. In the following description of the embodiment, the side wall part of the first bridge wiring 06 denotes the side wall part in the whole peripheral part of the first bridge wiring 06 including the oxide film 19 (the side wall part in the vertical direction of FIG. 1, that is, the side wall part in the lateral direction of FIG. 2(*a*)).

Figure 3:
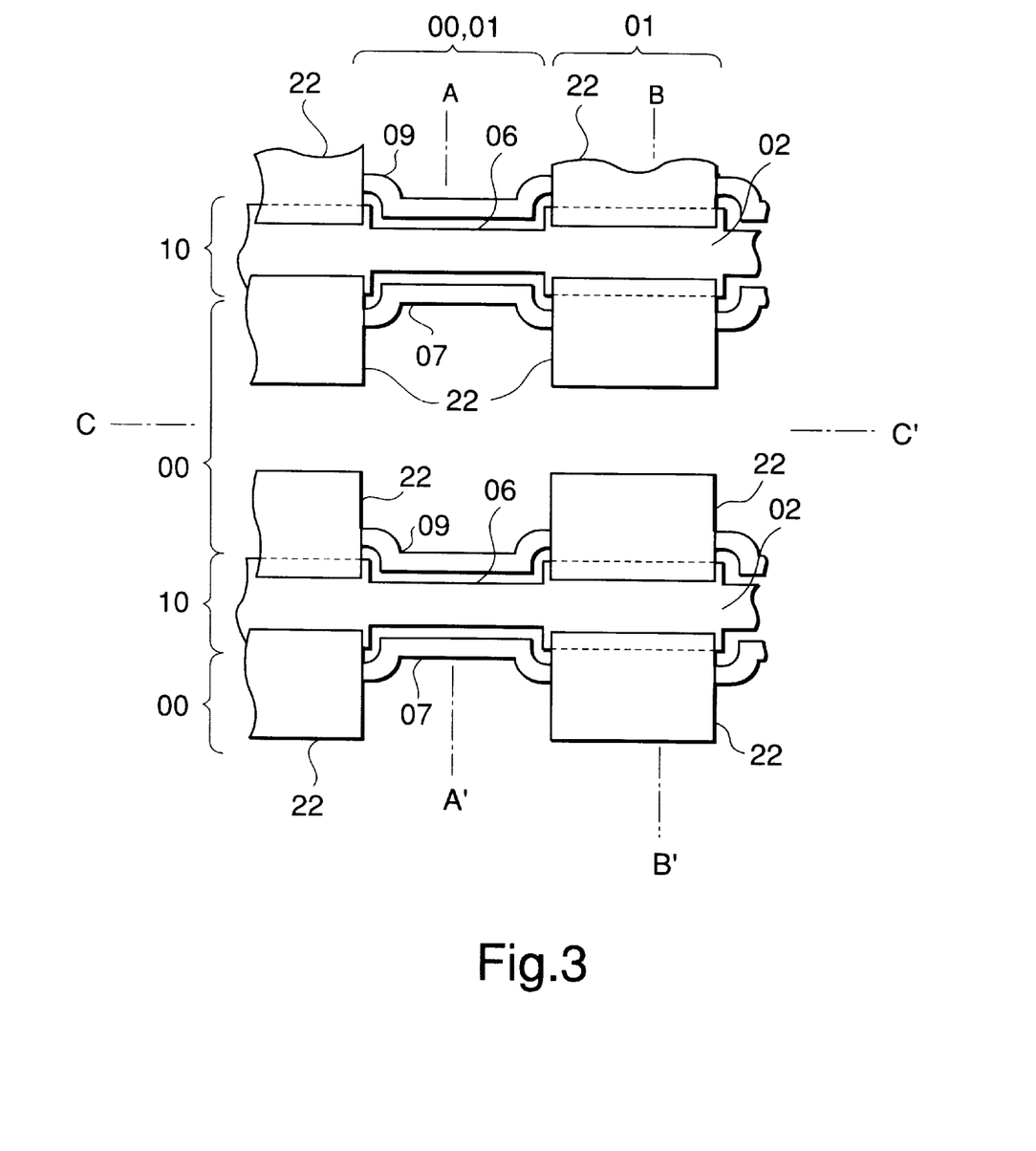
FIG. 3 is a plan view showing one of fabricating steps of a CCD-type solid state image pickup device according to an embodiment of the invention.
Figure 4:
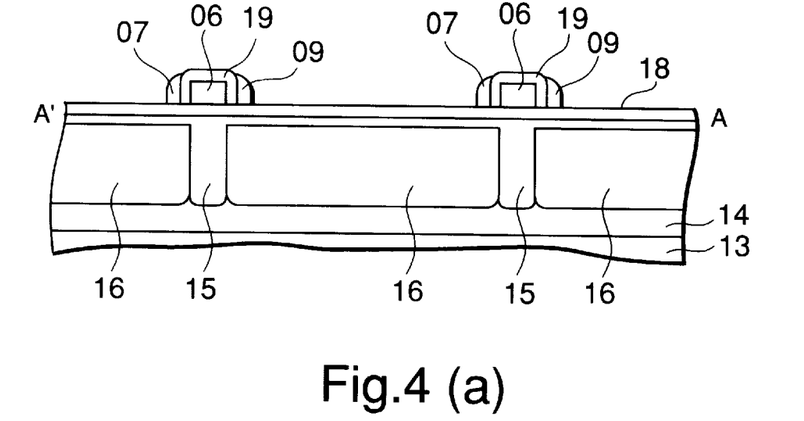
FIG. 4(a) is a cross section taken on line A–A' of FIG. 3.
FIG. 4(b) is a cross section taken on line B–B' of FIG. 3.
FIG. 4(c) is a cross section taken on line C–C' of FIG. 3.

The polysilicon layer containing an impurity such as phosphorus is deposited and the resist pattern of a photo resist 22 is formed only in predetermined regions as shown in FIGS. 3 and 4. The predetermined regions denote parts in which the second charge transfer electrode 03 and the fourth charge transfer electrode 05 of the charge transfer part 01 are to be formed.

The photo resist 22 formed in the above manner is used as a mask, the polysilicon layer is etched by anisotropic etching, thereby forming the second polysilicon layer, and the photo resist is removed. As mentioned above, the second polysilicon layer forms the second and fourth charge transfer electrodes 03 and 05 and the second and fourth bridge wirings 07 and 09. The shape of the second polysilicon layer will be described in detail. The part masked by the photo resist 22 in the second polysilicon layer is a part which is remained without being etched and serves as the second charge transfer electrode 03 and the fourth charge transfer electrode 05. On the other hand, the part which is not masked by the photo resist 22 is to be etched. However, since the anisotropic etching is performed, a part of the second polysilicon layer remains on both of the side walls of the first bridge wiring 06 (shown by reference numerals 07 and 09 in FIG. 2(*a*)). The remained second polysilicon layer which is not etched, that is the part except for the second and fourth charge transfer electrodes 03 and 05 in the second polysilicon layer serves as the second bridge wiring 07 and the fourth bridge wiring 09. As obviously understood from the diagram, the second bridge wiring 07 and the second charge transfer electrode 03 are continuously formed. Similarly, the fourth bridge wiring 09 and the fourth charge transfer electrode 05 are continuously formed. When attention is paid to each second bridge wiring 07, it connects two second charge transfer electrodes 03 neighboring in the second predetermined direction. Similarly, each fourth bridge wiring 09 connects two fourth charge transfer electrodes 05 neighboring in the second predetermined direction. It should be noted that the second and fourth bridge wirings 07 and 09 are not substantially formed in the upper part of the first bridge wiring 02 (in the upper part of FIG. 2(*a*)). With the construction, the flatness of the surface of such a part and the photoelectric transforming part 00 in which no electrodes and wiring are constructed can be improved. Since the second and fourth bridge wirings 07 and 09 are formed by using anisotropic etching in a self aligned manner, they are very thin. Consequently, in a later step, for example, when attention is paid to the lateral direction of FIG. 2(*a*), the opening 12 can be largely formed.

After forming the second and fourth bridge wirings 07 and 09 as mentioned above, unnecessary polysilicon remained on the side wall part of the first polysilicon layer is removed by using another photo resist pattern (not shown).

Subsequently, by performing the thermal oxidation, the oxide film 20 is formed in the peripheral part of the second polysilicon, that is, the second and fourth bridge wirings 07 and 09 and the second and fourth charge transfer electrodes 03 and 05.

Another polysilicon layer containing an impurity such as phosphorus is further deposited on the whole face and patterning is performed, thereby forming the third polysilicon layer as the third charge transfer electrode 04 and the third bridge wiring 08 which are continuously formed as shown in FIG. 2.

Further, the insulating film 21 is deposited on the whole face, the shielding film 11 made of a metal such as aluminium or tungsten is deposited, the patterning is performed to the shielding film 11, and the opening 12 is formed. Since the thickness of the second and fourth bridge wirings 07 and 09 can be suppressed as mentioned above, the opening 12 can be formed larger than that in the conventional technique.

The CCD-type solid state image pickup device of the embodiment as shown in FIGS. 1 and 2 is obtained as mentioned above.

An embodiment in which the invention is applied to an interlace CCD will be described hereinbelow.

Figure 10:
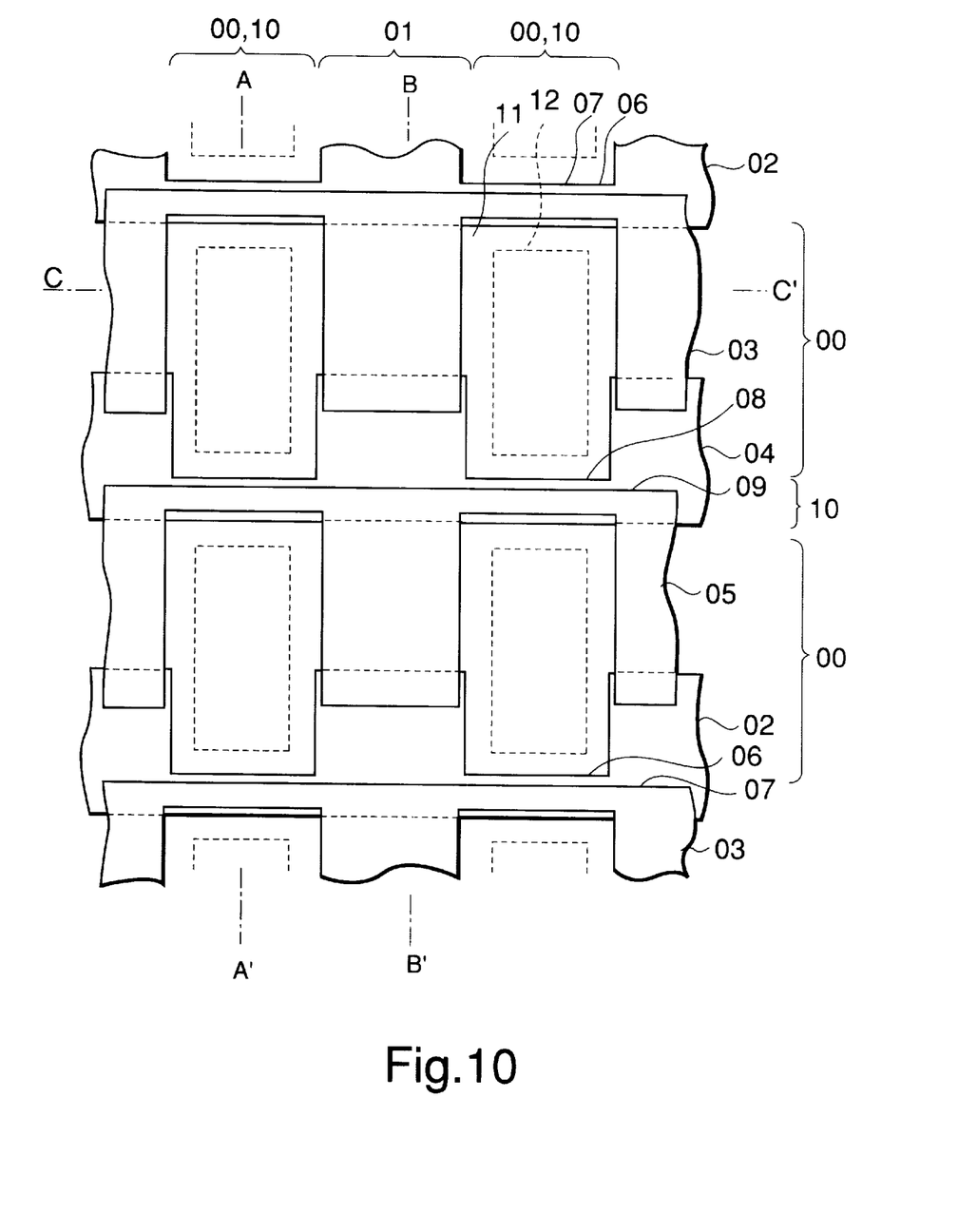
FIG. 10 is a plan view showing the construction of an interlace CCD-type solid state image pickup device as a reference for explaining superiority of the CCD-type solid state image pickup device according to the another embodiment of the invention.

FIG. 10 shows a solid state image pickup device as an object to be compared in order to clarify the superiority of the solid state image pickup device according to the embodiment. The construction of the solid state image pickup device as a reference will be described with reference to FIGS. 11(*a*) to 11(*c*).

Conventionally, the interlace CCD-type solid state image pickup device is widely used in television cameras for regular broadcast, business use, industrial use, and personal use.

Figure 11A:
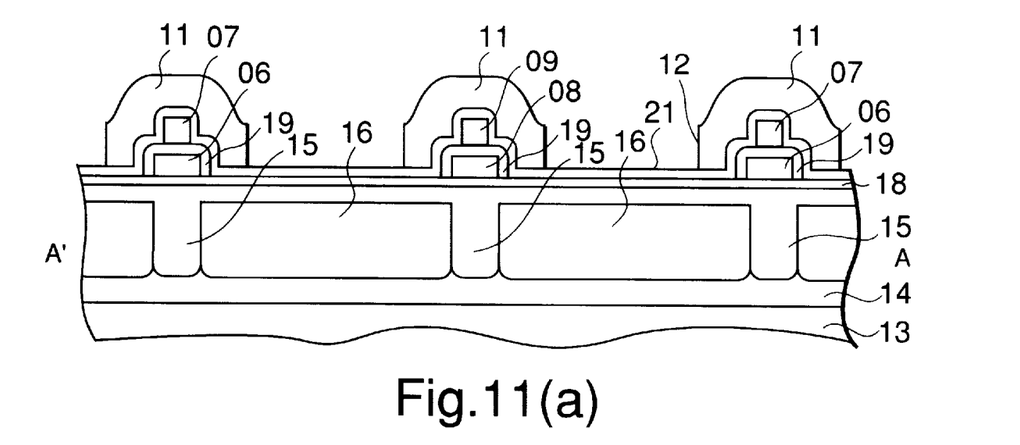
FIG. 11(a) is a cross section taken on line A–A' of FIG. 10.
Figure 11B:
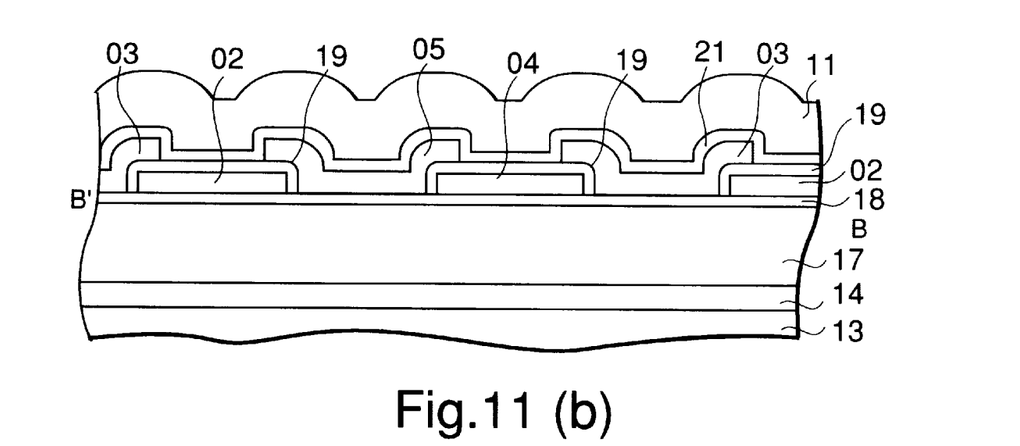
FIG. 11(b) is a cross section taken on line B–B' of FIG. 10.
Figure 11C:
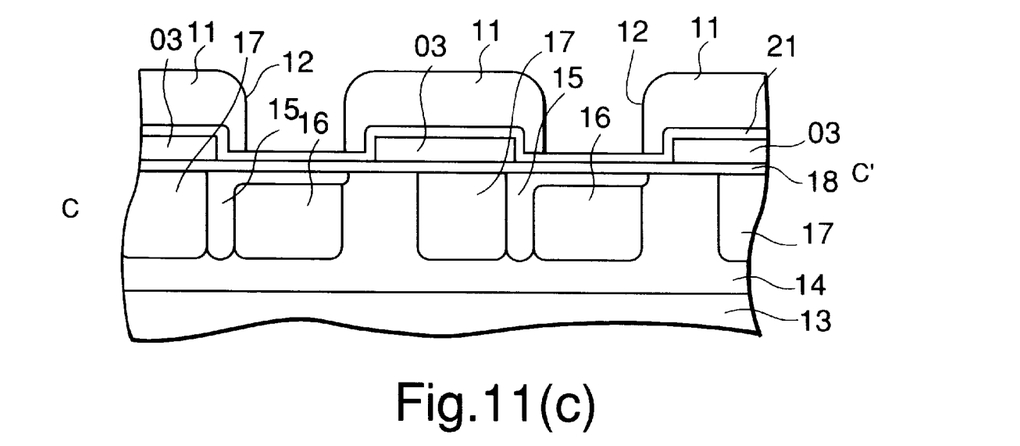
FIG. 11(c) is a cross section taken on line C–C' of FIG. 10.

As shown in FIG. 10, the CCD-type solid state image pickup device as a reference comprises: the photoelectric transforming parts 00 each having the opening 12; bridge regions 10 provided on and under each photoelectric transforming part 00 in the image region; and charge transfer regions 01 provided on the right and left sides of the photoelectric transforming part 00 and the bridge region 10 in the image region. The photoelectric transforming part 00 has the opening 12 formed in the shielding film 11 as shown in FIG. 11. The charge transfer region 01 has the first to fourth charge transfer electrodes 02 to 05. The bridge region 10 has the first and second bridge wirings 06 and 07 and the third and fourth bridge wirings 08 and 09. Further, the first to fourth charge transfer electrodes 02 to 05 of the charge transfer region 01 are connected to the first to fourth charge transfer electrodes 02 to 05 of the charge transfer region 01 neighboring in the horizontal direction of the image region by the first to fourth bridge wirings 06 to 09 of the bridge region 10.

The characteristic of the construction of the CDD-type solid state image pickup device as a reference compared with the progressive CCD is that the first and second bridge wirings 06 and 07 or the third and fourth bridge wirings 08 and 09 of the bridge region 10 are formed so that two polysilicon layers are piled up. That is, in the solid state image pickup device as a reference, the second bridge wiring 07 is piled on the first bridge wiring 06 and the fourth bridge wiring 09 is piled on the third bridge wiring 08.

In the solid state image pickup device as a reference, since the charge transfer electrodes and the bridge wirings are piled up in the vertical direction on the substrate, there are problems such that the flatness is bad and it is difficult to form the fine pattern.

For example, in the bridge region 10, since the second bridge wiring 07 is piled on the first bridge wiring 06 and the fourth bridge wiring 09 is piled on the third bridge wiring 08, the surface is not so flat and there are problems similar to those of the progressive CCD as a reference more or less.

Further, in the solid state image pickup device as a reference, since a certain degree of width of the bridge region 10 is necessary, the dimension of the opening 12 formed in the shielding film 11 is limited by the width of the bridge region 10. The dimension of the opening 12 formed in the shielding film 11 corresponds to the dimension of a photosensitive part of a photo diode. Consequently, it is difficult to increase the sensitivity of the solid state image pickup device as a reference.

The solid state image pickup device according to the embodiment will be described with reference to FIGS. 5 to 7.

Figure 5:
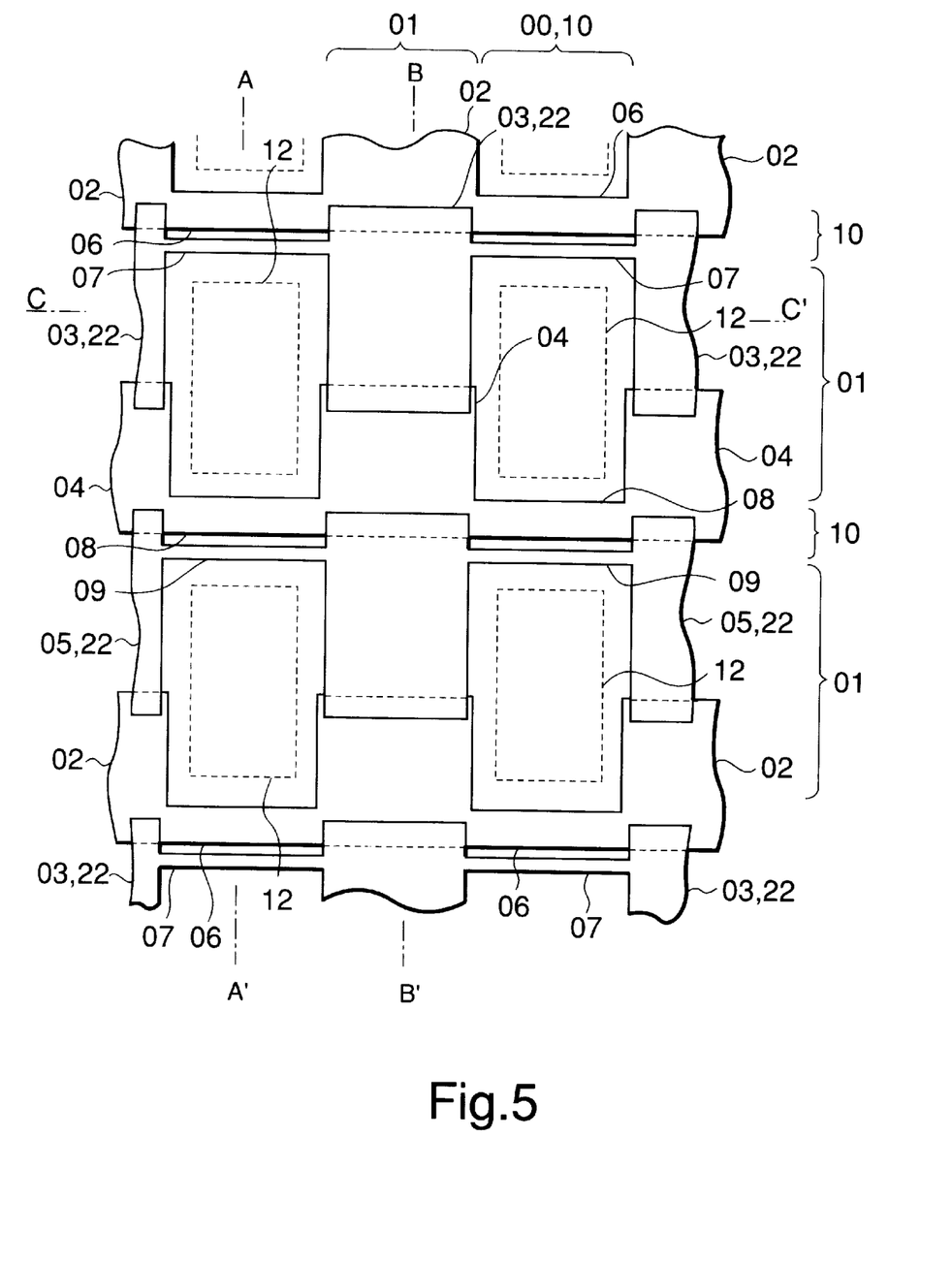
FIG. 5 is a plan view showing the construction of an interlace CCD-type solid state image pickup device according to another embodiment of the invention.
Figure 6:
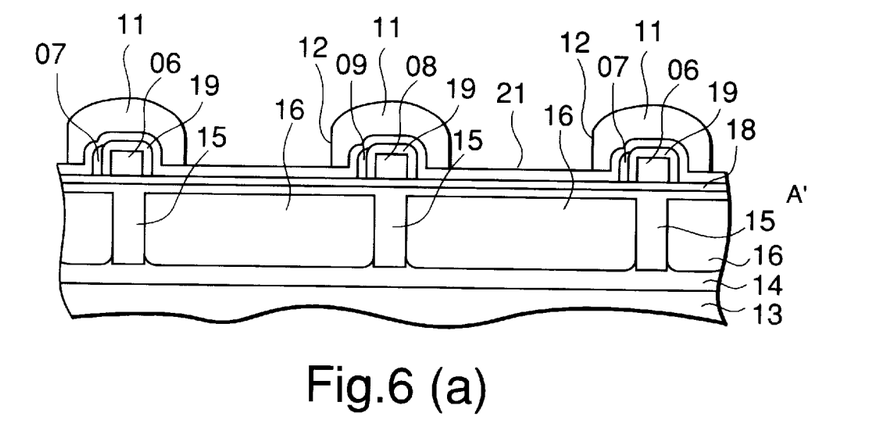
FIG. 6(a) is a cross section taken on line A–A' of FIG. 5.
FIG. 6(b) is a cross section taken on line B–B' of FIG. 5.
FIG. 6(c) is a cross section taken on line C–C' of FIG. 5.

The CCD-type solid state image pickup device according to the embodiment has the construction as shown in FIGS. 5 and 6. FIG. 5 is a plan view showing the construction of the CCD-type solid state image pickup device according to the embodiment. FIGS. 6(*a*) to 6(*c*) are cross sections taken on lines A–A', B–B' and C–C' of FIG. 5, respectively. The embodiment is realized by applying the concept of the invention to the interlace CCD-type solid state image pickup device.

The interlace CCD-type solid state image pickup device of the embodiment has, as shown in FIG. 5, a plurality of photoelectric transforming parts 00, a plurality of bridge regions 10, and a plurality of charge transfer regions 01.

The charge transfer regions 01 are provided so as to extend in a first predetermined direction (vertical direction of FIG. 5). The plurality of charge transfer regions 01 are formed at intervals in a second predetermined direction (lateral direction of FIG. 5). In the region sandwiched by the charge transfer regions 01 neighboring in the second predetermined direction, the bridge regions 10 are provided so that the plurality of photoelectric transforming parts 00 are sandwiched by photoelectric transforming parts 00 neighboring in the first predetermined direction. In the present embodiment as well, in a manner similar to the first embodiment, the region sandwiched by the charge transfer regions 01 neighboring in the second predetermined direction, that is, the region in which the bridge regions 10 and the photoelectric transforming parts 00 are alternately arranged in the first predetermined direction is called a photoelectric transforming region. The whole region having the charge transfer regions 01 and the photoelectric transforming regions is called an image region. For instance, the vertical direction of FIG. 5 is called the vertical direction of the image region and the lateral direction of FIG. 5 is called the horizontal direction of the image region.

Each of the photoelectric transforming parts 00 has the opening 12 for receiving and photoelectric transforming the light. Each of the charge transfer regions 01 is used to transfer charges obtained by photoelectric transforming the light in the corresponding photoelectric transforming part 00. The bridge region 10 is used to connect the charge transfer regions 01 neighboring in the second predetermined direction.

More specifically, as shown in FIG. 6(*a*), the photoelectric transforming part 00 has the opening 12 formed in the shielding film 11. As shown in FIG. 6(*b*), the charge transfer region 01 has the first to fourth charge transfer electrodes 02 to 05 with respect to two pixels in the vertical direction of the image region. Similarly, the bridge region 10 has the first to fourth bridge wirings 06 to 09 with respect to two pixels in the vertical direction of the image region. The first to fourth charge transfer electrodes 02 to 05 are electrically disconnected by interposing insulating members as shown in the cross section. Similarly, as understood from the cross section, the bridge wirings 06 to 09 are insulated from each other. Further, the first to fourth charge transfer electrodes 02 to 05 of the charge transfer region 01 are connected to the first to fourth charge transfer electrodes 02 to 05 of another charge transfer region 01 neighboring in the horizontal direction of the image region by the first to fourth bridge wirings 06 to 09 of the bridge part region 10, respectively. Especially, in the embodiment of the invention, as shown in FIG. 6(*a*), the side wall part of the whole peripheral part of the first bridge wiring 06 including the oxide film 19 of the first bridge wiring 06 or the third bridge wiring 08 formed by the first polysilicon layer, that is, the side wall part of the first or third bridge wiring 06 or 08 obtained by applying "the side wall part of the first bridge wiring 06" defined in the first embodiment to the present embodiment has the second or fourth bridge wiring 07 or 09. Consequently, as will be obviously understood from the drawing, the flatness is improved as compared with the conventional technique. Since the second and fourth bridge wiring 07 and 09 are obtained in a self aligned manner as will be described hereinlater, the thickness in the vertical direction of the image region can be reduced.

A method of fabricating the interlace CCD-type solid state image pickup device according to the present embodiment will be described hereinbelow.

The p-well region 14 is formed on the surface of the n-type silicon substrate 13. The p+ type device separating region 15, the n-type photoelectric transforming part 16, and the n-type charge transfer region 17 are sequentially formed.

The gate insulating film 18 made of silicon nitride, silicon oxide, or the like is formed on the whole face.

After the polysilicon layer containing an impurity such as phosphorus is deposited on the whole face of, for example, the gate insulating film 18, patterning is performed by using a photo resist of a predetermined shape, thereby forming a first polysilicon layer as the first charge transfer electrode 02, the third charge transfer electrode 04, the first bridge wiring 06, and the third bridge wiring 08, and then the photo resist is removed. Further, thermal oxidation is performed, thereby transforming the surface of the first polysilicon layer, that is, the peripheral part of the first and third charge transfer electrodes 02 and 04 and the first and third bridge wirings 06 and 08 to the oxide film 19.

Figure 7:
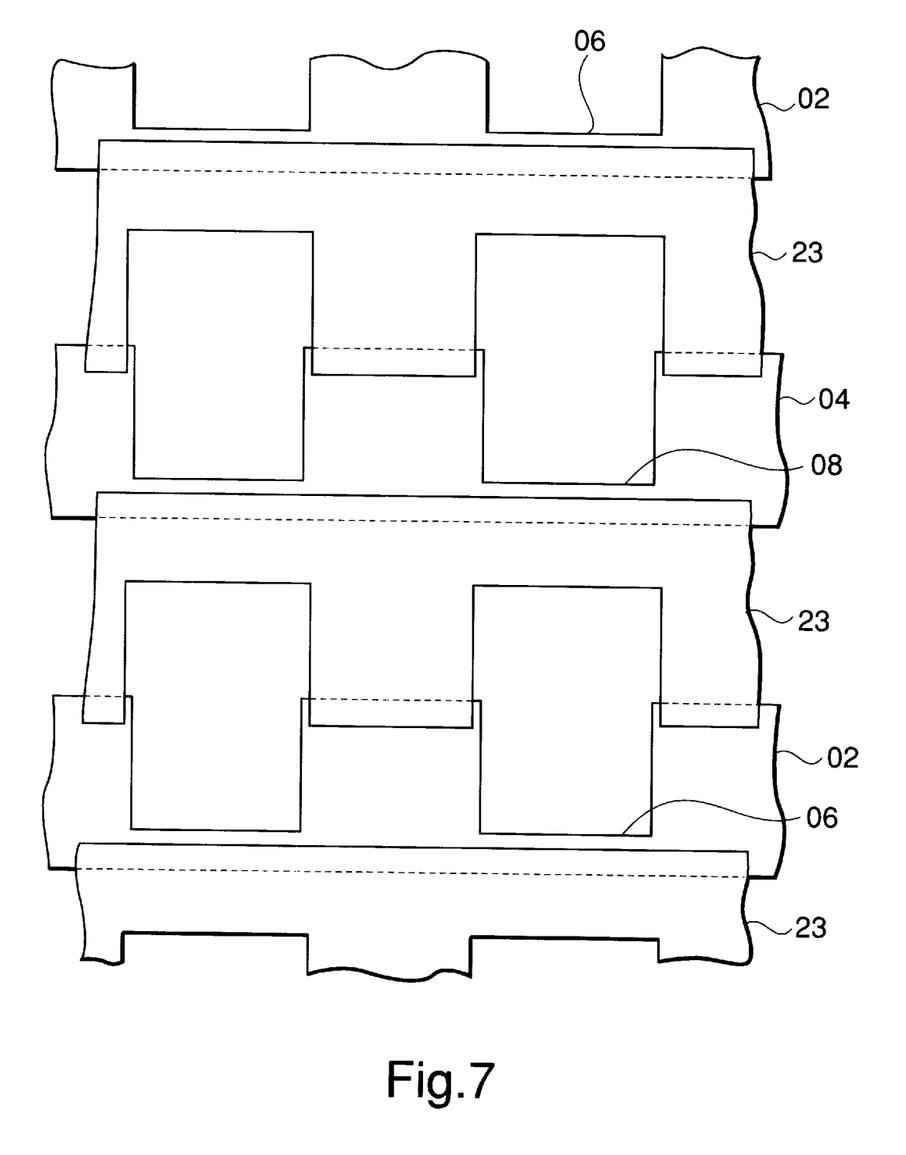
FIG. 7 is a plan view showing one of fabricating steps of a CCD-type solid state image pickup device according to another embodiment of the invention.

The polysilicon layer containing an impurity such as phosphorus is deposited on the whole face and, as shown in FIG. 7, the photo resist 23 is used as a mask and etching under predetermined conditions is performed. The predetermined conditions are the following two conditions in this case. The first condition is to etch the polysilicon layer so as to leave regions in which the second and fourth charge transfer electrodes 03 and 05 and the second and fourth bridge wirings 07 and 09 are to be formed. The second condition is to etch an unnecessary part of the polysilicon deposited on the side wall part of the first and third charge transfer electrodes 02 and 04.

After performing the etching under the conditions, the photo resist 23 is removed and a new photo resist 22 is formed. The shape of the photo resist 22 is the same as that of the second and fourth charge transfer electrodes 03 and 05 in the charge transfer region 01 shown in FIG. 5 (the second and fourth bridge wirings 07 and 09 in the bridge region 10 are not included).

The photo resist 22 having such a shape is used as a mask and the polysilicon layer is further etched by the anisotropic etching, thereby forming the second polysilicon layer and the photo resist 22 is removed. As mentioned above, the second polysilicon layer constructs the second and fourth charge transfer electrodes 03 and 05 and the second and fourth bridge wirings 07 and 09. The shape of the second polysilicon layer will be described in more detail. The part masked by the photo resist 22 in the second polysilicon layer is a remained part which is not etched. As understood from the shape of the photo resist 22, the part serves as the second and fourth charge transfer electrodes 03 and 05. On the contrary, the part which is not masked by the photo resist 22 is to be etched. However, since the anisotropic etching is performed, a part of the second polysilicon layer remains on the side wall part of the first and third bridge wirings 06 and 08 (shown by reference numerals 07 and 09 in FIG. 6(*a*)). Consequently, the remained part serves as the second and fourth bridge wirings 07 and 09 from the conditions of the etching using the photo resist 23 and the shape of the photo resist 22. As understood from the drawing, the second bridge wiring 07 and the second charge transfer electrode 03 are continuously formed and, similarly, the fourth bridge wiring 09 and the fourth charge transfer electrode 05 are continuously formed. When attention is paid to each second bridge wiring 07, it connects the second charge transfer electrodes 03 neighboring in the second predetermined direction. Similarly, each fourth bridge wiring 09 connects two fourth charge transfer electrodes 05 neighboring in the second predetermined direction.

It should be noted that the second and fourth bridge wirings 07 and 09 are not substantially formed in the upper part of the first and third bridge wirings 02 and 04 (the upper part of FIG. 6(*a*)). With the construction, the flatness of the surface of such a part and that of the photoelectric transforming part 00 in which the electrodes and wirings are not formed can be improved. Since the second and fourth bridge wirings 07 and 09 are formed in a self aligned manner by using the anisotropic etching, they are very thin. Consequently, for example, when attention is paid in the lateral direction of FIG. 6(*a*), the opening 12 can be largely formed in a later step.

After forming the second and fourth bridge wirings 07 and 09 and the like as mentioned above, the oxide film 21 is deposited on the whole face of the second polysilicon, that is, the second and fourth bridge wirings 07 and 09 and the second and fourth charge transfer electrodes 03 and 05.

The shielding film 11 made of a metal such as aluminium, tungsten, or the like is deposited and patterning is performed to the shielding film 11, thereby forming the opening 12.

In this manner, the interlace CCD-type solid state image pickup device as shown in FIGS. 5 and 6 can be obtained.

According to the invention as mentioned above, since another bridge wiring is arranged on the side wall part of one bridge wiring, the flatness is improved. When the resist is applied to the whole face, a thin photo resist can be consequently used, so that the focus margin is increased and the fine pattern can be accordingly easily formed. Since the etching residue does not easily occur on the side wall part of the base pattern in the event of etching the shielding film, the yield is improved.

Since the other bridge wiring is formed on the side wall part of the one bridge wiring in the self aligned manner, the thickness in the vertical direction of the image region is almost equal to the thickness of the deposited second polysilicon layer. The thickness is very small, for example, 100 to 200 nm. Thus, the opening formed in the shielding film can be enlarged and the sensitivity can be improved by about 20% as compared with the conventional technique on the same scale.

What is claimed is:

1. A solid state image pickup device comprising a plurality of photoelectric transforming regions in each of which a plurality of photosensitive devices are arranged in a first direction at predetermined intervals and a plurality of charge transfer regions for transforming charges obtained by photoelectric transforming operation of the photosensitive devices, the photoelectric transforming regions and the charge transfer regions being alternately arranged in a second direction which perpendicularly crosses the first direction, and bridge regions provided at the predetermined intervals of the photoelectric transforming regions to connect the charge transfer regions neighboring in the second direction, wherein the bridge region has:

a first wiring extending in the second direction;

an insulating film covering the first wiring in the bridge region, the insulating film having side wall portions and a top portion; and a second and a third wirings extending in the second direction formed on the side wall portions of the insulating film without covering the top portion of the insulating film.

2. A solid state image pickup device comprising: a plurality of photoelectric transforming regions in each of which a plurality of photosensitive devices are arranged in a first direction at predetermined intervals and a plurality of charge transfer regions each having first to third charge transfer electrodes for transferring charges obtained by photoelectric transforming operation of the photosensitive devices, the photoelectric transforming regions and the charge transfer regions being alternately arranged in a second direction which perpendicularly crosses the first direction, and bridge regions provided at the predetermined intervals of the photoelectric transforming regions in order to connect the first to third charge transfer electrodes of the charge transfer regions neighboring in the second direction, wherein the bridge region has:

a first wiring extending in the second direction to connect the first charge transfer electrodes neighboring in the second direction;

an insulating film covering the first wiring in the bridge region, the insulating film having side wall portions and a top portion; and a second and a third wirings extending in the second direction formed on the side wall portions of the insulating film without covering the top portion of the insulating film, the second and the third wirings connect the second and third charge transfer electrodes neighboring in the second predetermined direction.

3. A solid state image pickup device comprising:

a first and second photosensitive regions arranged in a first direction;

a first charge transfer region elongated to said first direction located along one side of said first and second photosensitive regions;

a second charge transfer region elongated to said first direction located along another side of said first and second photosensitive regions;

a first wiring connecting said first and second charge transfer regions, said first wiring being positioned between said first and second photosensitive regions;

a first insulating film covering said first wiring, said first insulating film having a first side surface, a second side surface, and a top surface;

a second wiring connecting said first and second charge transfer region, said second wiring being positioned between said first and second photosensitive regions on said first side surface of said first insulating film;

a third wiring connecting said first and second charge transfer regions, said third wiring being positioned between said first and second photosensitive regions on said second side surface of said first insulating film;

a second insulating film covering said second and third wirings; and a fourth wiring connecting said first and second charge transfer regions, said fourth wiring being positioned between said first and second photosensitive regions on said top surface of said first insulating film without covering said second insulating film.

* * * * *